United States Patent
Amanullah et al.

(10) Patent No.: US 7,092,686 B2
(45) Date of Patent: Aug. 15, 2006

(54) AUTOMATIC TRANSMIT POWER CONTROL LOOP

(75) Inventors: Abu Amanullah, San Diego, CA (US); Antoine J. Rouphael, Escondido, CA (US)

(73) Assignee: Siemens Communications, Inc., Boca Raton, FL (US)

(*) Notice: Subject to any disclaimer, the term of this patent is extended or adjusted under 35 U.S.C. 154(b) by 571 days.

(21) Appl. No.: 10/005,968

(22) Filed: Nov. 7, 2001

(65) Prior Publication Data

US 2002/0127980 A1 Sep. 12, 2002

Related U.S. Application Data

(60) Provisional application No. 60/274,554, filed on Mar. 8, 2001, provisional application No. 60/274,555, filed on Mar. 8, 2001.

(51) Int. Cl.
*H03G 3/20* (2006.01)
*H04B 1/04* (2006.01)

(52) U.S. Cl. .............................. 455/127.1; 455/127.2; 455/522; 455/115.3; 330/129

(58) Field of Classification Search ................ 455/418, 455/24, 522, 134, 136, 138, 186.1, 200.1, 455/69, 126, 127.1–127.5; 330/129, 131, 330/254, 278
See application file for complete search history.

(56) References Cited

U.S. PATENT DOCUMENTS

| 5,296,821 | A | * | 3/1994 | Petersen et al. ............. 330/141 |
| 5,648,955 | A | | 7/1997 | Jensen et al. ................ 370/252 |
| 5,655,220 | A | | 8/1997 | Weiland et al. ................ 455/69 |
| 5,732,341 | A | * | 3/1998 | Wheatley, III ........... 455/234.1 |
| 6,101,179 | A | | 8/2000 | Soliman ..................... 370/342 |
| 6,188,678 | B1 | | 2/2001 | Prescott ...................... 370/318 |
| 6,230,023 | B1 | | 5/2001 | Slanina ....................... 455/522 |
| 6,711,389 | B1 | * | 3/2004 | Medl et al. .............. 455/127.2 |
| 6,721,368 | B1 | * | 4/2004 | Younis et al. ................ 375/295 |

* cited by examiner

*Primary Examiner*—Lester G. Kincaid
*Assistant Examiner*—Matthew C Sams

(57) ABSTRACT

A transmitter includes a coupler (318) to measure output power. The output power is compared to a set value and a threshold. If the power is above the threshold, the gain of an output amplifier (316) is adjusted toward the set value. If the power is below the threshold, an extrapolation of the linear portion is used to obtain the set power level.

13 Claims, 4 Drawing Sheets

AUTOMATIC TRANSMIT POWER CONTROL LOOP

CROSS REFERENCE TO RELATED APPLICATIONS

The present application claims priority from U.S. Provisional Application Ser. No. 60/274,554, filed Mar. 8, 2001; from U.S. Provisional Application Ser. No. 60/274,555, filed Mar. 8, 2001; and from U.S. Non-provisional Application Ser. No. 09/952,346, filed Sep. 14, 2001; which are hereby incorporated by reference in entirety as if fully set forth herein.

BACKGROUND OF THE INVENTION

The present invention relates to telecommunications devices and, in particular, to an improved automatic power control loop for a wireless telecommunications transmitter.

The Federal Communications Commission (FCC) regulates the use of the radio frequency (RF) spectrum in the United States. Users of allocated bandwidth of the RF spectrum must take measures to ensure that radiated emissions inside and outside the allocated bandwidth are maintained within acceptable levels to avoid interfering with other users' operating in the same or other bandwidths. For example, users of cellular telephone systems must ensure that they are compliant with the level of radiated emissions allowable inside or outside the channels they have been assigned.

Cellular telephones such as, for example, CDMA (code division multiple access) or TDMA (time division multiple access) cellular telephones, include power amplifiers in the transmitter in which the power amplifier can be driven beyond a point where acceptable out of channel emissions are maintained. This is primarily due to the increased distortion output levels of the power amplifier at high powers.

Thus, regulating the transmitted signal power can reduce the amount of interference and spectral regrowth to a desired level. Certain wireless telecommunications transmitters, such as those used for cellular telephony, employ a transmit power control loop to regulate the transmitted signal power. In the mobile radio standard IS-95, for example, poorly regulated transmit power at the wireless terminal can lead to near-far effect at the base station demodulator, thus degrading the performance of the system. Similarly, in IS-136, drift in the transmit power loop can cause additional interference in the uplink channel, as well as spectral regrowth.

Regulating the transmitted signal power requires measurement or estimation of the actual transmitted signal power. However, this can be difficult, because modulation schemes such as DQPSK introduce signal power variations on the order of several decibels. On the digital side, this is due largely to the use of a square root raised cosine filter for pulse shaping as is required by the IS-136 standard, for example. FIG. 1 illustrates an exemplary instantaneous transmit power plot. As can be seen, the instantaneous transmit power fluctuates between −4 and −22 dB for eight times oversampling. FIG. 2 illustrates the corresponding signal constellation. Again, there is considerable fluctuation about the points of interest. The power is constant only is sampled at the maximum symbol peak.

Furthermore, components in the transmit chain, and particularly the power amplifier, tend to have a relatively wide variation in gain with respect to unit, temperature and frequency. Maintaining a given output power over all units, temperature, and frequency would typically require a multidimensional calibration table. This requires additional memory and software and, hence, adds to the cost of the telephone.

SUMMARY OF THE INVENTION

These and other drawbacks in the prior art are overcome in large part by a system and method according to the present invention.

A method according to one embodiment of the present invention includes programming a set power level; measuring at a coupler the transmitted power; and comparing the measured value to the set value. The gain of a power amplifier is adjusted incrementally towards a desired power level. At low power levels, the coupler measurement is not used. However, the TX APC characteristic is used to determine an "open loop" value. The slope may be determined each time two power points in the high power region of the TX APC characteristic are measured. If the telephone starts from the low power level, the set power value is obtained from the previously stored information.

A transmitter according to an embodiment of the present invention includes a coupler to measure output power. The output power is compared to a set value and a threshold. If the power is above the threshold, the gain of an output amplifier is adjusted toward the set value. If the power is below the threshold, the slope of the linear portion is used to obtain the set power level.

A wireless telephone according to an embodiment of the present invention includes a transmitter having a power coupler, and a controller implementing a level detector and a gain control unit, one or more transmit DACs, and memory. Nominal values for transmit DAC vs. transmit power are stored in the memory, as is a coupler vs. transmit power response. If the set power is above a threshold, then the nominal transmit DAC value associated with the set power is used to set the transmit DAC. The output of the power coupler is compared against the coupler vs. transmit power response. The transmit APC DAC value(s) are adjusted so that the measured coupler output values for transmit power match the value(s) from the coupler vs. transmit power response. The DAC value associated with this power value is then stored. If the set value is below the threshold, then the memory is accessed for past actual DAC vs. transmit power values, to determine an extrapolated DAC value. The extrapolated value is used to set the transmit DAC.

A better understanding of these and other specific embodiments of the invention is obtained when the following detailed description is considered in conjunction with the following drawings.

DETAILED DESCRIPTION OF EMBODIMENTS OF THE INVENTION

Figure 1:
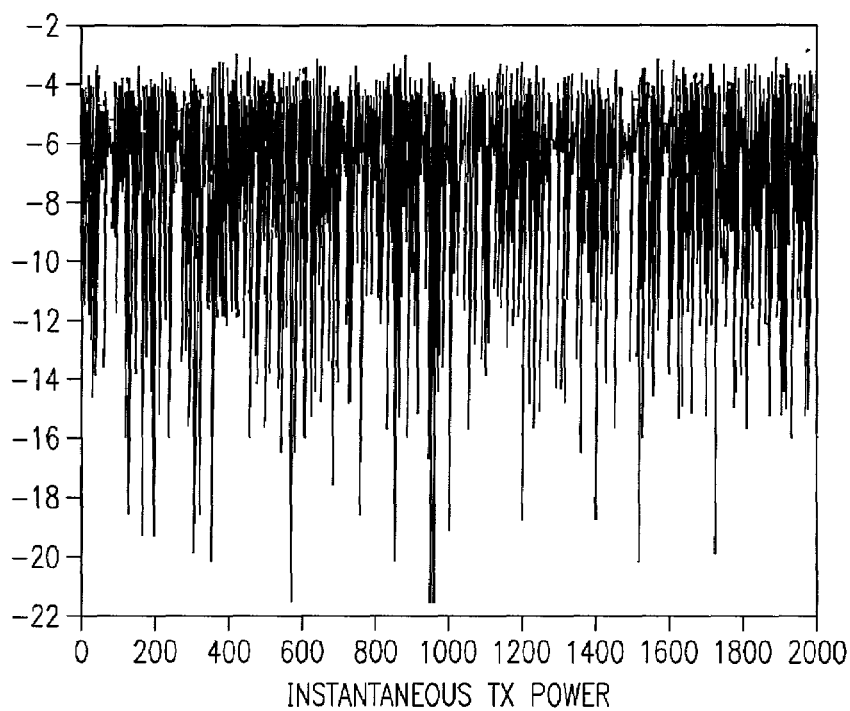
FIG. 1 is a diagram of instantaneous transmit signal power.
Figure 2:
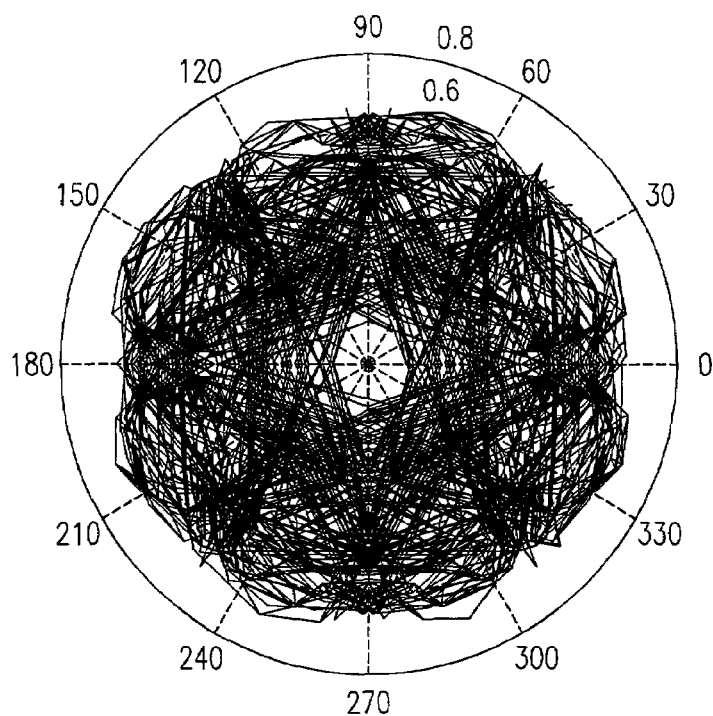
FIG. 2 is a signal constellation corresponding to the transmit signal power of FIG. 1.
Figure 3:
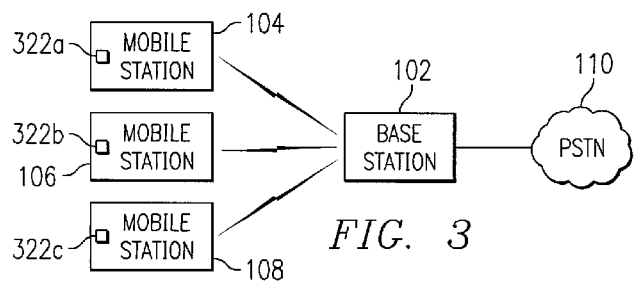
FIG. 3 is a diagram illustrating a telecommunications system according to an embodiment of the present invention.

Turning now to the drawings and, with particular attention to FIG. 3, a diagram of a telecommunications system 100 according to an embodiment of the present invention is shown. The system 100 may be an IS-136 or IS-95 or GSM based telecommunications network, for example. The system 100 includes at least one base station 102 serving a particular geographic region and a plurality of mobile stations 104, 106, 108 which may move in and out of the region. The base station 102 couples the mobile stations to the public switched telephone network (PSTN) 110. In addition, the mobile stations 104, 106, 108 include transmit power control units 322a-322c, respectively, according to embodiments of the present invention More particularly, a nominal transmit automatic power control (APC) digital-to-analog converter (DAC) vs. transmit power values and coupler output vs. transmit power values are initialized. Then, a transmit power value is set. If the value is above a threshold, a coupler provides a power amplifier output value to an A/D converter, which in turn provides the value to the transmit APC controller. The TX APC controller determines if the coupler value is above or below the nominal coupler value. The gain of the power amplifier (i.e., the actual transmit APC value is adjusted such that the coupler output is at the appropriate value.

Figure 4:
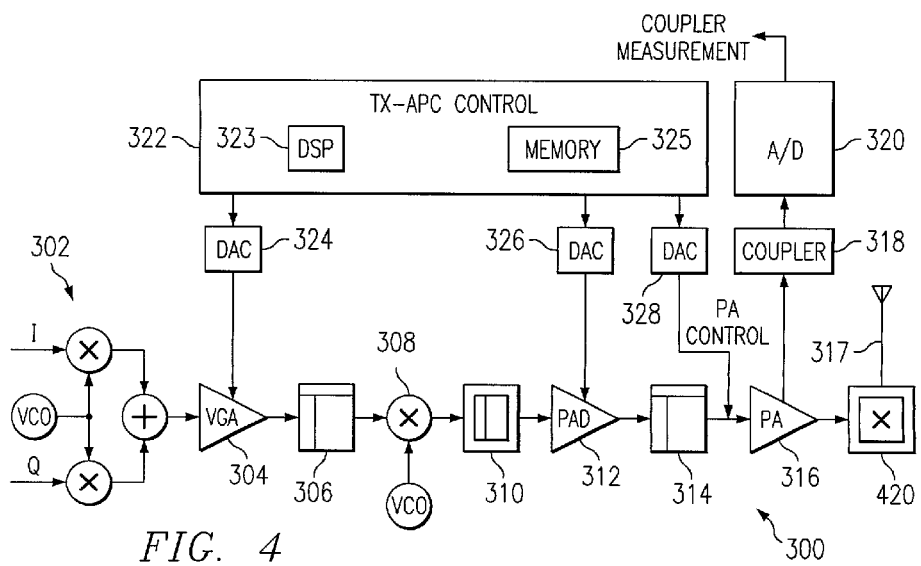
FIG. 4 is a diagram of an exemplary baseband RF transmitter according to an embodiment of the present invention.

Turning now to FIG. 4, a diagram illustrating an exemplary transmitter 300, typically present in the mobile stations 104, 106, 108, according to an embodiment of the invention is shown. The RF transmitter 300 includes an intermediate frequency (IF) modulator 302 for modulating the in-phase (I) and quadrature (Q) signals. The signal is then amplified using the variable gain amplifier (VGA) 304. The signal is then mixed to RF using RF modulator 308.

The signal may be provided to a power amplifier driver 312. The output of the power amplifier driver 312 is provided to the power amplifier 316. The output of the power amplifier 316 is then transmitted via antenna 317. In addition, various transmit filters 306, 310, 314 may be provided.

A coupler 318 estimates the transmit power at the power amplifier 316. An A/D converter 320 sends the coupler measurement back to the APC loop of the APC control unit 322 (FIG. 5) for further processing, as will be explained in greater detail below. The transmit APC control unit or power controller 322 provides control signals to DACs 324, 326, 328, which in turn, control the gain of VGA 304, power amplifier driver 312, and power amplifier 316. The TX-APC control 322 typically includes a control processor, such as a digital signal processor (DSP), and associated memory 325 for setting gain values in the DACs 324, 326, 328.

Figure 5:
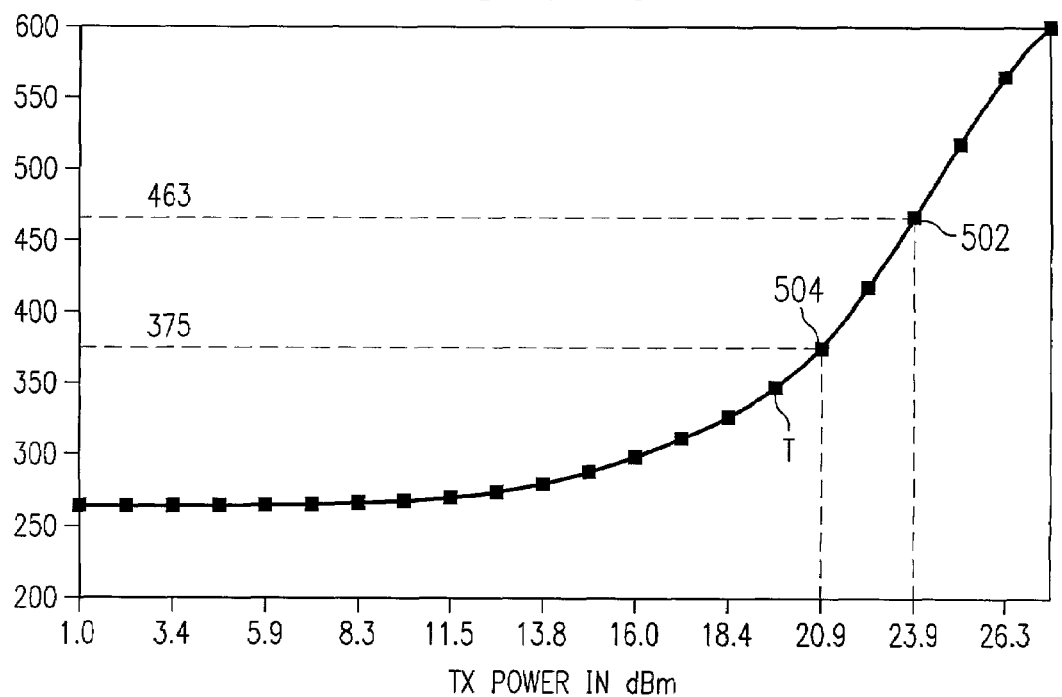
FIG. 5 is a diagram of nominal transmit DAC levels vs. transmit power according to an embodiment of the present invention.
Figure 6:
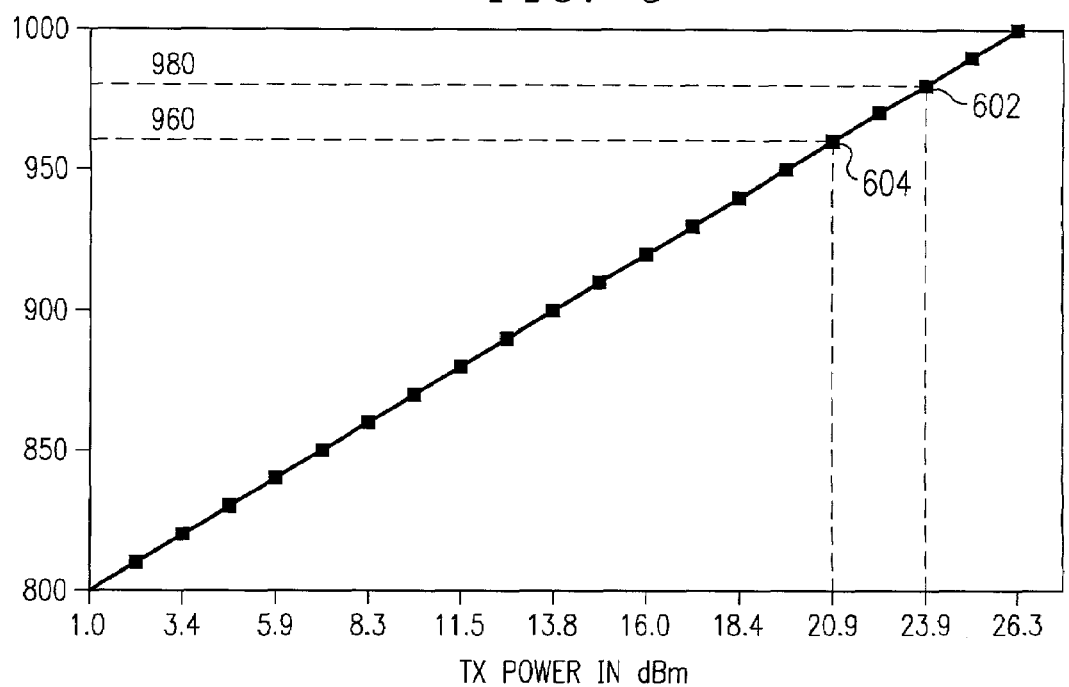
FIG. 6 is a diagram of coupler output vs. transmit power according to an embodiment of the present invention.

In operation, nominal TX APC DAC and transmit power values are set and stored, as are coupler output vs. transmit power values. For example, FIG. 6 illustrates an exemplary TX APC DAC value vs. transmit power graph. The horizontal axis is the nominal transmit power and the vertical axis is the transmit DAC (e.g., DAC 328) value. In FIG. 5, coupler output vs. transmit power is illustrated. The horizontal axis is transmit power; the vertical axis is the coupler value.

As will be explained in greater detail below, the transmitter receives a set power value (i.e., a power to transmit is specified). The coupler should have a value corresponding to the set coupler power from the curve of FIG. 5. If the set value is above a threshold, then a coupler measurement at the transmit output is made. The transmit APC DAC is adjusted until the coupler output matches the set value from FIG. 5. The new APC and power values are then stored. If the set power was below the threshold, then stored APC and power values are used to extrapolate a new APC value.

Operation of embodiments of the present invention will be described by way of example with reference to FIGS. 5–7. As noted above, FIG. 6 is a graph of the nominal TX APC DAC value vs. transmit power; and FIG. 5 illustrates a graph of the coupler output power vs. transmit power. It is noted that, while discussion will focus generally on transmit DAC 328, similar procedures can be used to set the other DACs 324, 326.

Initially, the graph of FIG. 6, or simply the slope and intercept (or any two points), are stored, as are the graph of FIG. 5 and a transmit power threshold value T. In operation, an initial power for transmission is set. For example, as shown in FIG. 6, an initial value of 23.9 dBm may be specified. From this value, a nominal TX APC DAC setting may be obtained. As shown, the value of 23.9 dBm corresponds to point 602 on the graph; this, in turn, corresponds to a DAC value of about 980. Since 23.9 dBm is greater than the threshold value T (FIG. 5), the transmit DAC is set with the value 980. The coupler output at the power amplifier 316 is then read. The coupler value read should correspond to a value from the graph of FIG. 5. In the example illustrated, this corresponds to a value of 463. The transmit DAC value is then adjusted up or down from 980 until the coupler output reaches this value. For example, the final transmit DAC value may actually be 985, rather than the nominal 980. This DAC value 985 actually corresponding to the coupler output value 463 is then stored in memory.

A similar procedure is used if another transmit power value is required. Thus, if the transmit power is specified to be 20.9 dBm, corresponding to point 604 (FIG. 6), and a DAC value of about 960. Again, 20.9 dBm is above the threshold T (FIG. 5). The value for set power of 20.9 dBm corresponds to a coupler value of about 375. The coupler output is then read, and the transmit DAC is adjusted until the coupler output corresponds to the value 375. The new DAC value, for example, 965, actually corresponding to the coupler output value 375 is then stored in memory.

Having two points allows an extrapolation if the set power value is then required to be under the threshold. Thus, if a set value of 16 dBm is required, which is less than the threshold value T, the previously stored actual DAC and actual power values are used to obtain a line and hence an extrapolated value for the DAC setting. The extrapolated value is then used.

Figure 7:
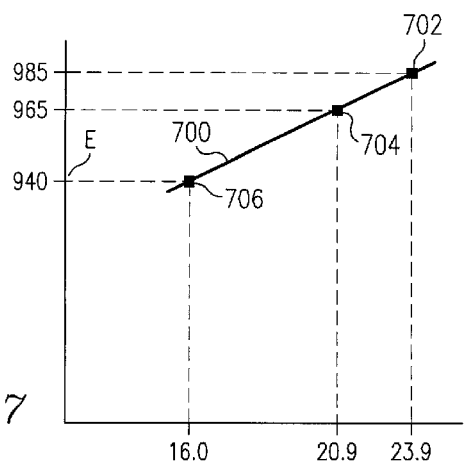
FIG. 7 is a graph illustrating extrapolating for a transmit DAC value according to an embodiment of the present invention.

For example, in FIG. 7, the points 702, 704 correspond to the values of transmit power and actual DAC values determined as described above. The points are used to determine the line 700; the new set power value of 16 dBm is then found and used to determine the point 706, and hence the extrapolated transmit DAC value E. In the example illustrated, this is about 940.

It is noted that, if the mobile station powers on to a level below the threshold, then the nominal DAC value (FIG. 6) is used until the power value is raised.

Figure 8:
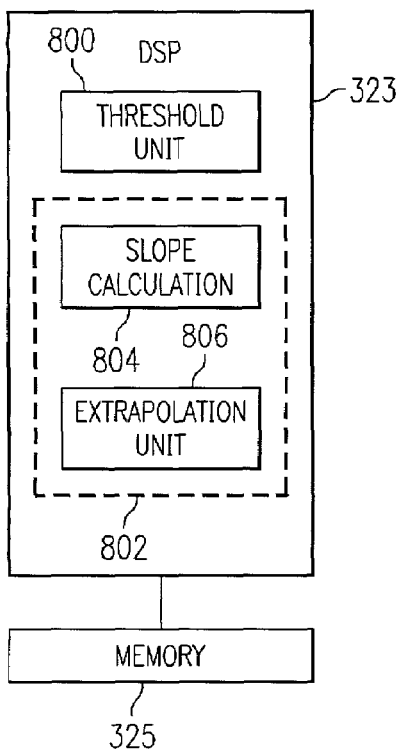
FIG. 8 is a block diagram illustrating functional modules according to an embodiment of the present invention.

FIG. 8 illustrates a block diagram of an exemplary DSP 323's functional units capable of implementing a system according to embodiments of the present invention. The system includes a threshold unit 800 and a gain adjustment unit 802. The gain adjustment unit 802, in turn, includes a slope calculation unit 804 and an extrapolation unit 806.

The threshold unit 800 compares the set value with a predetermined threshold value. If the set value is above the threshold, then the DSP 323 will determine the appropriate set coupler value and receive the actual output coupler 318 values. The gain adjustment unit 802 adjusts the gain of the DAC 328 such that the actual coupler value matches the set coupler value.

If the actual set power value is below the threshold, then the slope calculation unit 804 determines a line of actual transmit DAC values vs. transmit power from past values, either using points on a graph or using a slope of previous values. The extrapolation unit 806 then determines the appropriate DAC value from this line.

Figure 9:
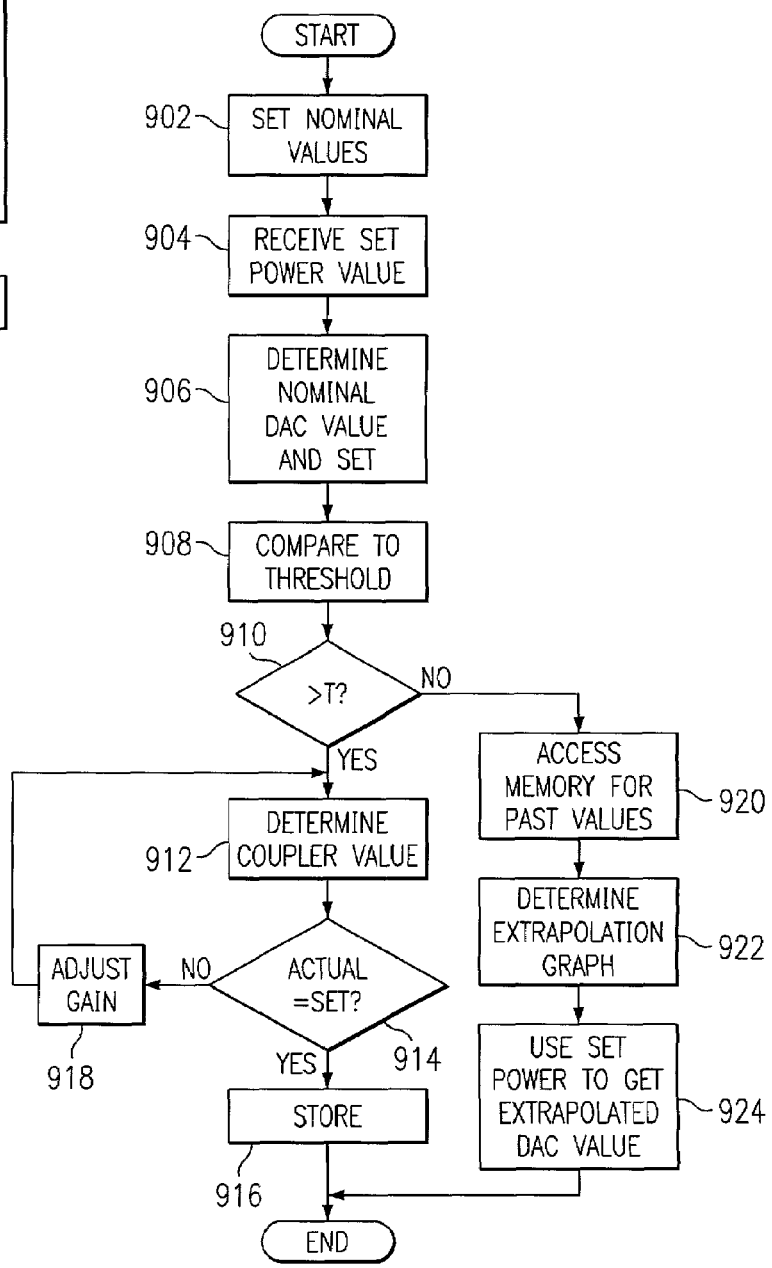
FIG. 9 is a flowchart illustrating operation of an embodiment of the present invention.

Operation of an embodiment of the present invention is shown with reference to the flowchart of FIG. 9. In a step 902, nominal values for the transmit DAC, output power, and coupler are initialized. For example, the graph of FIG. 6 may be stored in memory 325, or merely slope and intercept information associated with the graph may be stored. In addition, the graph of FIG. 5 and a threshold T may also be stored at this time. These values are typically programmed at the factory.

In step 904, the system receives an initial set transmit power value. In step 906, a corresponding nominal transmit DAC value is determined by the DSP 323, from the nominal values the system was initialized with, and the transmit DAC is set with the value. In addition, a coupler value is determined, e.g., from the graph of FIG. 5. In step 908, the transmit power set value is compared with the threshold value by the threshold unit 800. In step 910, if it is determined that the value is above the threshold, then output of the coupler 318 is obtained, in step 912. If, as determined in step 914, the actual coupler value is equal to the coupler value corresponding to the set value, then the values are stored in step 916 and the process ends. If the actual coupler value is not the same as the set value, then the gain (i.e., the DAC value) is adjusted in the appropriate direction in step 918, and the system cycles back to step 912.

Back in step 910, if the power set value was determined to be not greater than the threshold, then the memory 325 is accessed for past transmit DAC and transmit power values, in step 920. In step 922, an extrapolated graph is determined from the past values by the slope unit 804. Finally, in step 924, the set power is used to obtain the extrapolated DAC value by the extrapolation unit 806.

The invention described in the above detailed description is not intended to be limited to the specific form set forth herein, but is intended to cover such alternatives, modifications and equivalents as can reasonably be included within the spirit and scope of the appended claims.

What is claimed is:

1. A system, comprising:
a transmitter including a power amplifier; and
a power controller adapted to receive a coupler value of a power level at said output of said power amplifier if said power level is above a predetermined low power threshold and, if the coupler value is not equal to a set value, adjust a control value until the coupler value substantially equals the set value; and perform a low power extrapolation if said power level is below a predetermined threshold.

2. A system in accordance with claim 1, an output of said power controller adapted to control a setting of said power amplifier.

3. A method for use in a telecommunications transmitter, comprising:
initializing low power threshold, nominal transmit power, coupler, and transmit DAC values;
specifying a set power level;
setting a transmit DAC with a nominal transmit DAC value corresponding to said set power level;
reading an output of a power coupler and determining a power coupler value after said transmit DAC is set with said nominal transmit DAC value;
comparing said power coupler value to a nominal power coupler value;
adjusting said transmit DAC such that said power coupler value substantially matches said nominal power coupler value if said set power level is greater than said low power threshold;
extrapolating past transmit DAC values to set said transmit DAC if said set power level is less than said low power threshold.

4. A method in accordance with claim 3, wherein said threshold defines a linear region of a coupler vs. transmit power response.

5. A radio transmitter system, comprising:
a transmitter having a variable gain amplifier; and
means for adjusting a gain level of said variable gain amplifier, said adjusting means configured to receive a coupler value corresponding to a power level at an output of said variable gain amplifier if said power level is greater than a predetermined low power threshold and, if the coupler value is not equal to a set value, adjusting said pain level until the coupler value substantially equals the set value, and
means operably coupled to the gain level adjusting means for extrapolating a low power pain level if said power level is less than said predetermined low power threshold.

6. A radio transmitter system in accordance with claim 5, said adjusting means further including a slope calculation unit adapted to provide a power curve value to said extrapolating means if a power measurement is less than said predetermined threshold.

7. A system, comprising:
a transmitter including a power amplifier configured to receive an initial set power level; and
a power controller configured to adjust an output of said power amplifier based on a low power extrapolation of a power measurement if said set power level is below a predetermined low power threshold and adjust said output based on said power measurement until an output coupler value corresponds to a nominal value if said set power level is above said predetermined low power threshold.

8. A system in accordance with claim 7, wherein said low power extrapolation is derived from a past values on a power curve.

9. A system comprising:
a transmitter including a power amplifier;
a level detector configured to compare a set power level with a low power threshold;
a power controller configured to adjust an output of said power amplifier based on a low power extrapolation of a coupler output if said set power level is below said low power threshold and adjust an output of said power amplifier until said coupler output corresponds to a nominal value if said set power level is above said predetermined threshold.

10. A system In accordance with claim 9, wherein said power controller is adapted to adjust a gain level of a power amplifier.

11. A system in accordance with claim 10, wherein determining said extrapolation comprises determining a value of an output power curve using past measured values of said output power.

12. A telecommunications device, comprising:
a transmitter including a power amplifier controlled via a transmit DAC;
a level detector adapted to compare a power level with respect to a low power threshold;
a power controller adapted to adjust a value of said transmit DAC based on a low power extrapolation of a coupler output if said power level is below said low power threshold; and
wherein said power controller is adapted to adjust a value of said transmit DAC based on said output of said power coupler if said set power level is above said low power threshold until a coupler value is substantially equal to said power level.

13. A system, comprising:

a transmitter including a power amplifier; and means configured to receive a coupler value of a power level at said output of said power amplifier if said power level is above a predetermined low power threshold and, if the coupler value is not equal to a set value, adjusting a control value until the coupler value substantially equals the set value; and performing a low power extrapolation if said power level is below a predetermined threshold.

* * * * *